July 27, 1965 P. W. REDCAY 3,197,717
SYMMETRICAL VARIABLE FREQUENCY ASTABLE MULTIVIBRATOR
Filed June 22, 1962
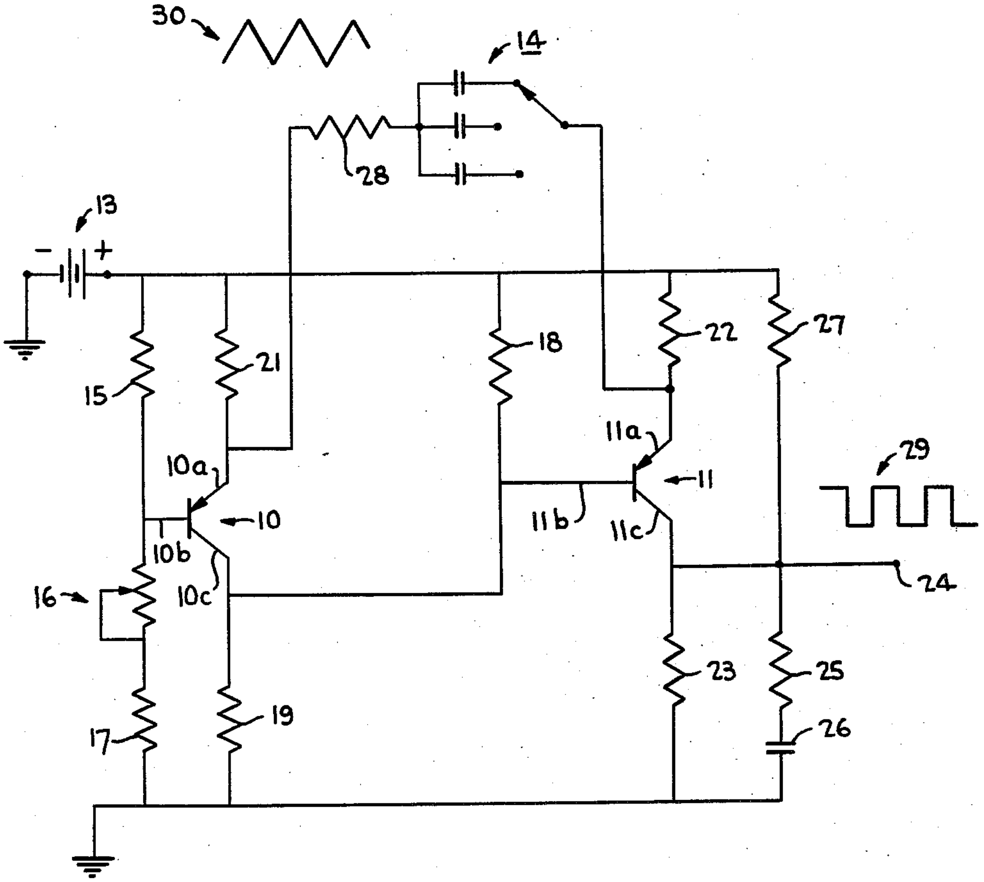
INVENTOR
P. WILSON REDCAY
BY S. J. Rotondi, A. J. Dupont & J. P. Edgerton United States Patent Office 3,197,717

Patented July 27, 1965

3,197,717

SYMMETRICAL VARIABLE FREQUENCY ASTABLE MULTIVIBRATOR

Paul Wilson Redcay, Washington, D.C., assignor to the United States of America as represented by the Secretary of the Army Filed June 22, 1962, Ser. No. 204,651

4 Claims. (Cl. 331—113)

(Granted under Title 35, U.S. Code (1952), sec. 266)

The invention described herein may be manufactured and used by or for the United States of America for governmental purposes without the payment to me of any royalty thereon.

This invention relates to oscillators and more particularly to junction transistor oscillators.

Under certain circuit conditions a direct coupled junction transistor amplifier will exhibit negative resistance characteristics, and this characteristic has been used in the past to construct junction transistor multivibrators. Astable, or free running, multivibrators of this type have been constructed by coupling the collector of the second transistor through a feedback capacitor to the base of the first transistor. Pulse generators of this type are described in more detail in "Principles of Transistor Circuits," by R. F. Shea, published by John Wiley and Sons Incorporated, New York, 1953, pages 286 to 289. The advantages of such multivibrators for use as pulse generators are, their simplicity and reliability, and the fact that the pulse repetition rate may be easily varied by varying the feedback capacitor. However, with such prior art devices, changing the pulse repetition rate made the output pulse train unsymmetrical. That is, the high current time of the output waveform would no longer equal the low current, or dead time. Further, the switching time was slow, and the output pulses were only approximations of a square wave.

Therefore, it is an object of this invention to provide an improved transistor oscillator wherein the pulse output waveform is improved and remains symmetrical although the pulse repetition frequency is varied.

A further object of this invention is to provide a multiple transistor oscillator wherein the output waveform is substantially independent of manufacturing variations in the transistor characteristics.

A still further object of this invention is to provide a junction transistor oscillator wherein the pulse repetition frequency is stable.

These and other objects of the present invention are achieved through the use of a pair of junction transistors which are connected to form a direct coupled amplifier. In accordance with the teaching of this invention, the frequency determining feedback impedance is connected between the emitters of the respective transistors. Since the emitters are a low impedance source switching time and the pulse waveform are improved. Furthermore, stray shunt capacitance associated with the transistors, which are frequency dependent, has a reduced effect on the performance of the oscillator as the pulse repetition frequency is varied. Additionally a frequency responsive impedance is placed in shunt with the collector of the output transistor, to compensate for any variation in collector impedance due to variations in the pulse repetition frequency.

The specific nature of the invention, as well as other objects, uses and advantages thereof, will clearly appear from the following description and from the accompanying drawing in which:

The sole figure is a schematic diagram of one form of the relaxation oscillator of this invention.

Referring to the figure, there is shown a specific embodiment of a junction transistor relaxation oscillator of the astable or free running type which is designed to produce a square wave pulse output, the pulse repetition rate of which may be varied over a wide range without changing the symmetry of the pulse output waveform. The principal components are two pnp junction transistors 10 and 11, a frequency determining feedback capacitance 14, and a power supply 13. The transistors 10 and 11 are in a grounded emitter configuration, connected to form a direct coupled amplifier.

These components are interconnected to form a free running oscillator in the following manner. The base 10*b* of transistor 10 is biased to be normally conducting by means of a voltage divider network comprising resistor 15, variable resistor 16, and resistor 17. Variable resistor 16 may be used to initially adjust the symmetry of the output pulse train. The base 11*b* of transistor 11 is also biased to be normally conducting by means of a voltage divider comprising a resistor 18 and resistor 19. Resistor 19 also serves as a collector resistor for transistor 10. The transistor 10 has an emitter resistance 21, and the transistor 11 has an emitter resistor 22 and collector resistor 23. The output pulse wave train is taken from collector resistor 23 and appears at terminal 24. Shunting the collector resistor 23 is an impedance network comprising resistor 25 and capacitor 26 and tends to correct for any slight change in symmetry as the pulse repetition rate changes. Resistor 27 provides a limiting value on the amplitude of the output pulse. The collector 10*c* of transistor 10 is directly connected to the base 11*b* of the transistor 11, to form the direct coupled amplifier. The emmitters 10*a* and 11*a* of transistors 10 and 11 are interconnected by a feedback loop comprising capacitors 14 and current limiting resistor 28.

The operation of the circuit is as follows: Assuming that the circuit is quiescent, with the capacitor 14 uncharged, the circuit is energized by the activation of the source 13. The transistor 11 will begin to conduct heavily, causing a sharp reduction in the voltage at its emitter 11*a*. This sharp reduction in voltage will be transferred to the emitter 10*a* of transistor 10 by the capacitor 14, tending to keep transistor 10 cut off. The voltage on the emitter 10*a* of transistor 10 will then rise toward the potential of source 13, the rise time depending upon the value of the capacitor 14, as the capacitor 14 charges through resistors 21 and 28 and the low impedance of transistor 11. When the voltage on the emitter 10*a* has risen to a suitable value the transistor 10 will start to conduct. This causes the voltage on the collector 10*c* to rise, and since this is directly coupled to the base 11*b* of transistor 11 it will tend to cut transistor 11 off. The emitter voltage of transistor 11 will rise, and this will be transferred through the capacitor 14 to the emitter 10*a* of transistor 10 causing it to conduct more heavily. A regenerative switching action will take place in this manner until transistor 10 is conducting heavily and transistor 11 is cut off. The capacitor 14 will maintain this condition until it is discharged through transistor 10 allowing the emitter voltage of 10*a* of transistor 10 to drop, and the emitter voltage 11*a* of transistor 11 to rise. As the emitter voltage 10*a* drops the collector voltage 10*c* also drops, while at the same time the emitter voltage 11*a* of transistor 11 is rising. When the emitter 11*a* of transistor 11 is sufficiently positive with respect to its base 11*b* the transistor 11 will again begin to conduct, and the cycle is repeated. The voltage variation at the capacitor 14 is represented at 30, and the output pulse waveform is shown at 29.

As will be apparent from the operation of the circuit illustrated the frequency of the pulse output is determined primarily by the value of the capacitor 14. The frequency, or pulse repetition rate, may be varied simply by switching in different values of capacitor 14. Since the emitter of either transistor 10 or 11 is of low impedance when the transistor is conducting, the effect of stray shunt capacitance associated with the transistors is reduced, and the output waveform will remain symmetrical for a wide variation in pulse repetition rates.

A further improvement in symmetry may be obtained throughout a wide variation in pulse repetition frequency by use of resistance capacitance network 25 and 26. The shunt impedance presented by this network decreases as the pulse repetition frequency increases, and this tends to correct for any change in symmetry as the pulse repetition rate is varied.

Suitable components and circuit parameters are as follows:

| | |
|---|---|
| **10, 11** | 2N523A pnp junction transistors. |
| **14** | .2 to .0068 microfarad. |
| **13** | 20 volts. |
| **15** | 2.2K ohms 165K ohms. |
| **17** | 11K ohms. |
| **18** | 4.7K ohms. |
| **19** | 3.3K ohms. |
| **21** | 910 ohms. |
| **22** | 2.7K ohms. |
| **23** | 2.7K ohms. |
| **25** | 33K ohms. |
| **26** | 150 micromicrofarads. |
| **27** | 18K ohms. |
| **28** | 1.2K ohms. |

It will be apparent that the embodiment shown is only exemplary and that various modifications can be made in construction and arrangement within the scope of the invention as defined in the appended claims.

I claim as my invention:

1. A transistor square-wave generator having a variable pulse repetition rate comprising:

(a) first and second transistors, each of said transistors having a base, an emitter, and a collector, said first and second transistors being interconnected to form a direct-coupled amplifier with the collector of said first transistor directly connected to the base of said second transistor;

(b) a first common voltage junction;

(c) a second common voltage junction;

(d) biasing means connected between the base and said first common voltage junction and the base and said second common voltage junction of each of said transistors, said biasing means rendering both of said transistors normally conducting;

(e) a first load impedance connected between the collector of said first transistor and said second common voltage junction;

(f) a second load impedance connected between the collector of said second transistor and said second common voltage junction;

(g) frequency determining feedback means comprising:

(1) a first fixed resistance connected between the emitter of said first transistor and said first common voltage junction;

(2) a second fixed resistance connected between the emitter of said second transistor and said first common voltage junction; and (3) a variable capacitance connected between the emitters of said first and second transistors;

(h) an output terminal connected to the collector of said second transistor; and (i) means connected in shunt with said second load impedance of said second transistor for compensating for any variation in collector impedance due to variations in the pulse repetition frequency.

2. A transistor square-wave generator having a variable pulse repetition rate as recited in claim 1 wherein said biasing means is variable on at least one of said transistors to adjust the symmetry of the output pulse train.

3. A transistor square-wave generator having a variable pulse repetition rate as recited in claim 2 wherein said means for compensating for any variation in collector impedance includes a capacitance.

4. A transistor square-wave generator having a variable pulse repetition rate as recited in claim 3 further including a pulse amplitude limiting impedance connected between the collector of said second transistor and said first common voltage junction.

References Cited by the Examiner

UNITED STATES PATENTS

| | | | |
|---|---|---|---|
| 2,410,920 | 11/46 | Atwood | 331—144 X |
| 2,750,502 | 6/56 | Gray | 331—144 |
| 2,834,885 | 5/58 | Shute | 331—144 |
| 2,929,030 | 3/60 | Wier | 331—113 |
| 3,013,220 | 12/61 | Norris | 331—113 |
| 3,061,800 | 10/62 | Matzen | 331—113 X |
| 3,076,152 | 1/63 | Biard et al. | 331—113 |

OTHER REFERENCES

Bosselaers: "The Free Running Multivibrator," Raytheon Semiconductor Engineering File No. 125 T, February 1960 (7 pages).

ROY LAKE, *Primary Examiner.*

ARTHUR GAUSS, *Examiner.*